United States Patent [19]

Mayr et al.

[11] Patent Number: 4,777,060
[45] Date of Patent: Oct. 11, 1988

[54] METHOD FOR MAKING A COMPOSITE SUBSTRATE FOR ELECTRONIC SEMICONDUCTOR PARTS

[75] Inventors: Kurt Mayr, Wangle; Reinhard Staffler, Ehenbichl; Werner Tippelt, Linz; Walter Scharizer, Gallneukirchen, all of Austria

[73] Assignee: Schwarzkopf Development Corporation, New York, N.Y.

[21] Appl. No.: 908,333

[22] Filed: Sep. 17, 1986

[51] Int. Cl.$^4$ .......................... B05D 1/00; B05D 1/08; C23C 16/30

[52] U.S. Cl. ......................... 427/34; 427/96; 427/99; 427/123; 427/126.1; 427/126.3; 427/126.4; 427/249; 427/255.2; 427/255.3; 427/405; 427/409; 427/419.2; 427/419.7; 437/235; 437/238; 437/241; 437/245

[58] Field of Search ............ 427/34, 190, 88, 96, 427/99, 123, 125, 189, 126.1, 126.3, 126.4, 255.2, 255.3, 248.1, 405, 409, 419.2, 419.7, 249; 437/225, 230, 238, 235, 241, 245

[56] References Cited

U.S. PATENT DOCUMENTS

| | | | |
|---|---|---|---|
| 3,259,558 | 7/1966 | Hagiwara et al. | 427/126.4 |
| 3,340,164 | 9/1967 | Zimmerman | 427/409 |
| 3,499,799 | 3/1970 | Patterson | 427/405 |
| 3,691,421 | 9/1972 | Decker et al. | 427/126.4 |
| 3,885,063 | 5/1975 | Schachner et al. | 427/255.3 |
| 4,327,155 | 4/1982 | Hanneman | 427/405 |
| 4,412,377 | 11/1983 | Nagashima et al. | 427/34 |
| 4,440,804 | 4/1984 | Milgram | 427/99 |
| 4,451,496 | 5/1984 | Gedwill et al. | 427/34 |
| 4,495,378 | 1/1985 | Dotzer et al. | 174/68.5 |
| 4,592,927 | 6/1986 | Stall | 427/255.3 |

Primary Examiner—Sadie L. Childs
Attorney, Agent, or Firm—Morgan & Finnegan

[57] ABSTRACT

A method is provided for making a composite substrate for electronic semiconductor parts. The composite substrate has a metal core, an insulating layer, and a conducting layer. The insulating layer is deposited by chemical vapor deposition in the gaseous phase on the metal core, or by chemical vapor deposition in combination with other techniques, such as plasmaspraying and/or melting. The metal core is comprised of a highly heat-resistant refractory metal, e.g., molybdenum, tungsten, titanium, molybdenum-manganese alloy, or a high-alloy steel having a permeability of about 1.002. The insulating layer is comprised of an inorganic material such as aluminum oxide or aluminum nitride. The conducting layer typically comprises copper.

9 Claims, 1 Drawing Sheet

METHOD FOR MAKING A COMPOSITE SUBSTRATE FOR ELECTRONIC SEMICONDUCTOR PARTS

FIELD OF THE INVENTION

The present invention relates to composite products such as composite printed circuit boards and the like, and processes for the manufacture of composite products, having a metal core, an insulating layer deposited on the metal core, and a conducting layer deposited on the insulating layer.

BACKGROUND OF THE INVENTION

Electronic circuits and the electronic components mounted thereon have become increasingly more compact. As a result, attempts have been made to utilize the printed circuit boards themselves as a means for dissipating heat. Composite printed circuit boards typically contain a metal core layer made of copper, steel or aluminum and an insulating layer made of plastic or enamel overlying the metal core layer. It has been previously suggested to use the metal core layer to dissipate heat.

While the metallic core layer of existing composite printed circuit boards may afford some thermal conductivity, the insulating layer used in conjunction with such metal cores has not been entirely satisfactory. For example, plastic insulating layers have poor temperature resistance. Moreover, since the plastic layer must also be relatively thick, because of the manufacturing techniques used to apply plastics, a high thermal resistance can occur between the conducting layer and the metallic core which can sharply reduce heat dissipation in the core layer. In addition, the elevated dielectric constant of conventional plastic materials leads in some applications to unacceptable capacitance between the individual printed circuits and/or between the conducting layer and the core layer.

Enamel insulating layers have also been suggested. Those materials may resolve some of the problem of temperature sensitivity, and may afford better heat conductivity than plastics, but enamel layers are difficult to apply, particularly in thin layers, and are too porous. Coating inaccessible spots, such as corners, or inner surfaces of boreholes, is not practical using enamels. Composite printed circuit boards typically contain boreholes to connect different layers of the printed circuit, or to connect electronic components mounted on the boards.

Heat generation of electronic components can present additional problems. Due to the different coefficients of expansion of the printed circuit (and the composite layers therein) thermal stresses can arise between the layers. For this reason—particularly in the presence of repeated mechanical stresses—solder joints connecting the electronic components to conventional boards often become broken after only short periods of use.

It would be highly desirable, therefor, to provide a composite printed circuit board having a coefficient of heat expansion closely comparable to the coefficient of heat expansion of the conventional electronic components mounted thereon. In this way, thermal stress between the composite printed circuit board and the electronic components can be reduced.

A printed circuit has been proposed (German Pat. No. 30 35 749) consisting of an iron core and having an anodized aluminum coating as an insulating layer. An intermediate copper layer can be deposited on the iron core according to the patent. The deposition of copper layers on anodized aluminum using electroplating methods is disclosed in U.S. Pat. No. 3,340,164.

This known technique produces layers with relatively good thermal conductivity. However, the anodized aluminum oxide layer produced by electroplating is not entirely satisfactory and, in addition, small cavities, such as boreholes in the composite printed circuit board, are poorly coated using this method.

Accordingly, it would be highly desirable to provide a product and process which permits the low-cost mass production of high-grade printed circuits having high heat dissipation and good insulating properties. It would also be desirable to provide a composite printed circuit having a refractory metal (e.g., molybdenum) core and an inorganic insulating layer, such as aluminum oxide or aluminum nitride. (Aluminum oxide has about three times the heat conductivity of enamel, and about fifteen times the heat conductivity of typical plastics). Moreover, the thermal coefficient of expansion between aluminum oxide and molybdnum are quite compatible and are close to that of silicon (typically used in printed circuit boards). In contrast, the thermal coefficient of expansion of steel, copper and plastics are typically quite different from silicon, thus resulting in thermal stresses.

While there would be considerable value in using aluminum oxide or aluminum nitride as an insulating layer, no effective technique has been suggested for applying these materials onto a refractory metal core for use in composite boards. Nor has a technique been suggested which would apply the aluminum oxide or aluminum nitride layer of sufficient density to reduce the thickness of that layer while providing the desired insulating ability.

Accordingly, it would be highly desirable to provide an aluminum oxide layer in a composite circuit board having good adhesion to the metal core and which is densely composited onto the metal.

SUMMARY OF THE INVENTION

Accordingly, it is an object of the present invention to provide composite products, such as composite printed circuit boards having high heat dissipation characteristics, good insulating properties and structural integrity.

It is another object of this invention to provide composite printed circuit boards comprising a refractory metal core such as molybdenum or alloy steel and an inorganic insulating layer, such as aluminum oxide or aluminum nitride.

It is another object of this invention to provide a process for the production of composite printed circuit boards having high heat dissipation characteristics and good insulating properties.

It is another object of the invention to provide composite printed circuit boards comprised of a refractory metal core, an inorganic insulating layer satisfactorily adhered onto the refractory metal core, and a conducting layer satisfactorily adhered onto the insulating layer.

These and other objects are accomplished by applying an inorganic layer by chemical vapor deposition onto a refractory metal core comprised of a highly heat resistant metal, for example molybdenum, high alloy steel, tungsten, titanium, or a molybdenum-manganese alloy, or combinations thereof, and by thereafter depositing a conducting layer onto an inorganic insulating layer by chemical wet deposition.

The method according to the present invention makes it possible to manufacture low-cost composite printed circuit boards which have homogeneous and mechanically resilient insulating layers. Chemical deposition from the gaseous phase—such as the technique described in Austrian Pat. No. 316,160—enables inorganic insulating coatings to be uniformly deposited on the metallic surface, thereby making it feasible to coat otherwise inaccessible areas such as, for example, inner surfaces of boreholes or corners. The method according to the invention also includes depositing a conducting layer onto the insulating layer by, e.g., chemical wet deposition, rather than, e.g., plating. The chemical wet deposition method lends itself more readily to coating "through contacts," such as boreholes, which connect two or more planes of printed circuits.

According to another aspect of the invention, a thin organic layer, such as a thin polyimide film, can be interposed between the insulating layer and the conducting layer and other techniques can be employed in combination with chemical vapor deposition to deposit the inorganic material onto the metal core.

DESCRIPTION OF THE DRAWING FIGURES

DETAILED DESCRIPTION OF THE INVENTION

Figure 1:
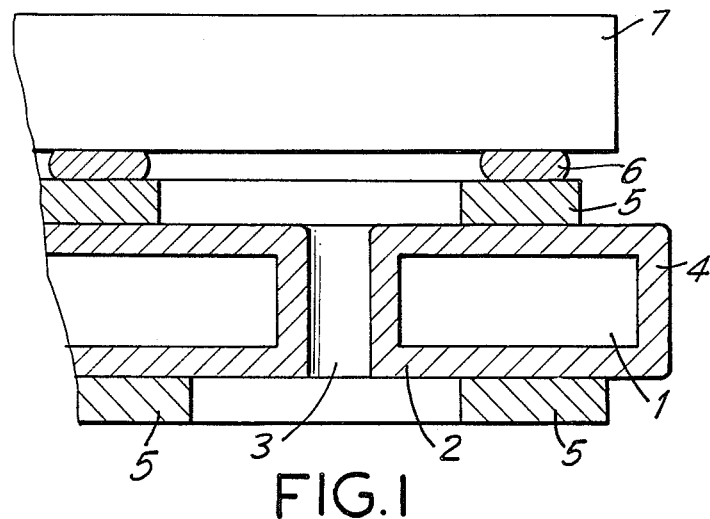
FIG. 1 shows a cross section of a composite printed circuit board produced in accordance with the invention, having printed circuits disposed on both sides of the board. The Figure shows an electronic component soldered onto the printed circuit board.

Referring now to FIG. 1, an insulating layer 2 comprised, e.g., of aluminum oxide is deposited onto metal core 1. The metal core 1 is comprised of a refractory metal, for example, molybdenum, high alloy steel, tungsten, titanium, a molybdenum-manganese alloy, or combinations thereof. One preferred material for the metal core is high-alloy steel having a permeability $\mu$ 1.002. Such steels have high chromium and nickel contents. They have the requisite thermal resistance and have a favorable effect on the electric conductance of the printed circuit because, due to low permeability, the undesirable inductance in the circuit can be kept low. The metal core is configured in the form of a plate or foil. The thickness of metal core 1 is determined, e.g., by the requirements for mechanical stability and thermal resistance. Typically, the thickness can range from about 0.5 to 2 mm.

As seen in drawing FIG. 1, metal core 1 can be coated on both sides with insulating layer 2. Advantageously, insulating layer 2 covers inaccessible or difficult to cover places such as borehole 3 and borders 4 of metal core 1.

Conducting layer 5 is disposed over insulating layer 2 and, as shown in the drawing FIG. 1, can be positioned on both sides of insulating layer 2. Electronic components 7 can be mounted on conducting layer 5 or can be connected to conducting layer 5 via a conductive solder joint 6.

The composite printed circuit board according to the invention is produced as follows:

The metal core 1 made of molybdenum, high alloy steel or other refractory metal such as tungsten, titanium, or a molybdenum-manganese alloy, or combinations thereof, is shaped into the desired form and placed into a coating furnace following an appropriate surface pretreatment (cleaning). At relatively high temperatures, usually between 700° and 1100° C., carrier gases and the vaporized metal halogenide are introduced into the furnace to deposit the insulating layer by chemical vapor deposition. These gases contain, e.g., aluminum oxide ($Al_2O_3$), aluminum nitride (AlN). Aluminum nitride is a preferred insulating layer material because it is inexpensive and affords good thermal conductivity. Alternatively, the inorganic layer can be deposited by chemical vapor deposition in combination with other known techniques such as by plasmaspraying or melting. Advantageously, while aluminum oxide and aluminum nitride can be deposited by chemical vapor deposition, other techniques can be used to add additional materials in the inorganic layer such as silicon nitride ($Si_3N_4$), silicon dioxide $SiO_2$, zirconium dioxide ($ZrO_2$), magnesium oxide (MgO), boron nitride (BN) and/or carbon.

As a result of a chemical reaction on the surface of the metal core, a dense, smooth insulating layer 2 is formed. Typically an aluminum oxide or aluminum nitride layer is deposited thereon; however, layers or combinations of layers of oxides of, nitrides or carbonitrides, for example, oxides of titanium, silicon, beryllium, magnesium, zirconium, hafnium, calcium, etc., can also be deposited as indicated above. A special advantage of the chemical vapor deposition technique is that even inaccessible spots, such as boreholes, edges, corners, etc., can be coated. It may be desirable to introduce a bond-promoting layer between the metal core and the insulating layer. It may also be desirable to seal the insulating layer pores prior to coating with the conducting layer. An organic layer, such as a thin polyimide film, can be interposed between the insulating layer and the conducting layer for this purpose.

The conducting layer is then applied onto the metal core 1 and insulating layer 2 by, e.g. chemical wet deposition. The conducting layer is typically comprised of conductive metals, such as copper, silver, gold, or combinations thereof. The conducting layer is deposited on the insulating layer by known wet chemical deposition methods whereby an adequate bond is ensured by chemical surface treatment. The deposition is performed either over the entire surface of the insulating layer wherein the desired printed conductors are later obtained by etching, or directly in the required final printed conductor configuration. This wet deposition also offers the advantage that—in contrast, for example, to deposition by plating—the conducting layer can be applied onto otherwise inaccessible spots.

Figure 2:
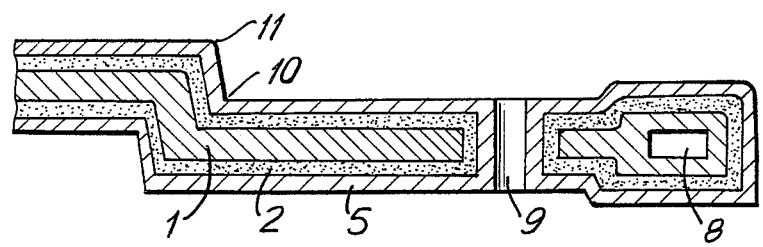
FIG. 2 is a cross section of another composite printed circuit board according to the invention, showing cooling means as an additional feature.

FIG. 2 shows a two plane printed circuit which has the same layer configuration as that in FIG. 1, except that this design features at the edge of the metal core 1 a channel 8 through which a coolant medium can flow. In this design, the inner surface of borehole 9 is not only coated with insulating layer 2, but is also in through-contact with conducting layer 5 in order to connect the printed conductors of the two planes. The printed circuits fabricated according to the present invention can be bent or curved at will because the coating of corners 10 or sharp edges 11 is done without undue difficulty.

It will be understood that while the drawing shows printed circuits coated on both sides (the so-called printed sandwich circuits) the invention applies equally to single-plane printed circuits. Moreover, because of the good heat dissipation, printed circuits according to the invention may be combined to form multilayer plates.

In the case of high packing density of the electronic components and/or high levels of component heat generation, the forced cooling embodiment can be used, for example, by a coolant liquid or a cooling gas circulating in channels shown in FIG. 2.

It will be apparent from the above that although the invention is illustrated with respect to composite printed circuit boards, substrates for chips can be made using this method, by simply varying the dimensions and keeping the design of the printed circuits the same.

We claim:

1. A method for the manufacture of a composite substrate for electronic semiconductor parts comprising:
   providing a metal core comprised of a refractory metal selected from the group consisting of molybdenum, tungsten, titanium, molybdenum-manganese alloy, and high alloy steel or combinations thereof;
   depositing an inorganic material onto said metal core by chemical vapor deposition to form an insulating layer on said metal core; and
   depositing a conducting material onto said insulating layer by wet chemical deposition.

2. The method according to claim 1 wherein said refractory metal is selected from the group consisting of molybdenum and tungsten or combinations thereof.

3. The method according to claim 1 wherein an interlayer is interposed between said insulating layer and said conducting layer.

4. The method according to claim 3 wherein the interlayer is comprised of a polyimide film.

5. The method according to claim 1 wherein the conductive layer is deposited by electroless plating.

6. The method of claim 1 wherein the conducting layer is comprised of copper.

7. The method of claim 1 wherein the insulating layer is comprised of aluminum oxide or aluminum nitride.

8. The method of claim 1 wherein said insulating layer is deposited by chemical vapor deposition in combination with a method selected from the group consisting of plasmaspraying and melting on the surface of the metal core or combinations thereof.

9. The method of claim 8 wherein the insulating layer comprises aluminum oxide in combination with an inorganic material selected from the group consisting of aluminum nitride, silicon nitride, silicon dioxide, zirconium dioxide, magnesium oxide, cubic boron nitride, and carbon having a diamond structure, and combinations thereof.

* * * * *